United States Patent
Kitamura

(10) Patent No.: US 10,475,669 B2
(45) Date of Patent: Nov. 12, 2019

(54) METHOD FOR FABRICATING MACH-ZEHNDER MODULATOR, MACH-ZEHNDER MODULATOR

(71) Applicant: SUMITOMO ELECTRIC INDUSTRIES, LTD., Osaka (JP)

(72) Inventor: Takamitsu Kitamura, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/880,316

(22) Filed: Jan. 25, 2018

(65) Prior Publication Data

US 2018/0226270 A1     Aug. 9, 2018

(30) Foreign Application Priority Data

Feb. 6, 2017  (JP) ................. 2017-019589

(51) Int. Cl.
  *H01L 21/56*  (2006.01)
  *G02F 1/225*  (2006.01)
  *H01L 21/283*  (2006.01)
  *G02F 1/21*  (2006.01)

(52) U.S. Cl.
  CPC .......... *H01L 21/563* (2013.01); *G02F 1/2257* (2013.01); *H01L 21/283* (2013.01); *G02F 2001/212* (2013.01)

(58) Field of Classification Search
  CPC ..... G02F 1/225; G02B 26/06; G02B 26/0841; H04B 10/505
  USPC ...................................................... 359/276
  See application file for complete search history.

(56) References Cited

U.S. PATENT DOCUMENTS

| | | | |
|---|---|---|---|
| 2013/0177037 A1* | 7/2013 | Yagi | H01S 5/3013 |
| | | | 372/50.1 |
| 2014/0116983 A1* | 5/2014 | Kitamura | G02F 1/025 |
| | | | 216/13 |
| 2015/0023627 A1* | 1/2015 | Kimura | G02F 1/2257 |
| | | | 385/3 |

FOREIGN PATENT DOCUMENTS

JP    2013-183026    9/2013

* cited by examiner

*Primary Examiner* — Mohammed A Hasan
(74) *Attorney, Agent, or Firm* — Smith, Gambrell & Russell, LLP.

(57) ABSTRACT

A method for fabricating a Mach-Zehnder modulator includes: forming a resin body embedding a semiconductor mesa for an arm waveguide, the resin body having an opening on an upper face of the semiconductor mesa; forming an electrode on the semiconductor mesa and the resin body, the electrode being in contact with the upper face of the semiconductor mesa through the opening of the resin body; forming an inorganic insulating protective layer on the electrode and the resin body, the inorganic insulating protective layer having an arrangement of multiple first openings therethrough to the electrode; and forming a metal body on the inorganic insulating protective layer and the electrode, the metal body being in contact with the electrode through the multiple first openings of the inorganic insulating protective layer.

11 Claims, 12 Drawing Sheets

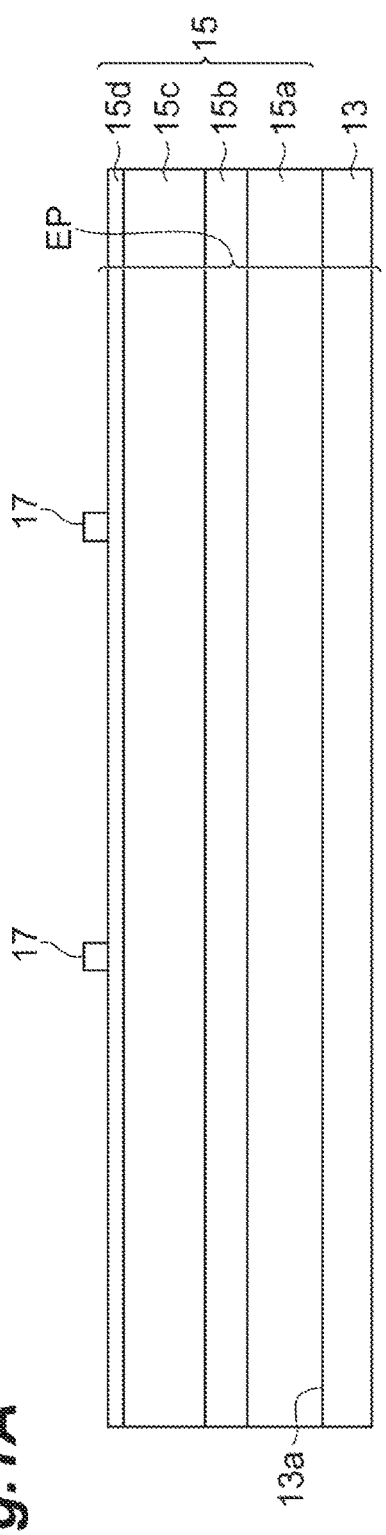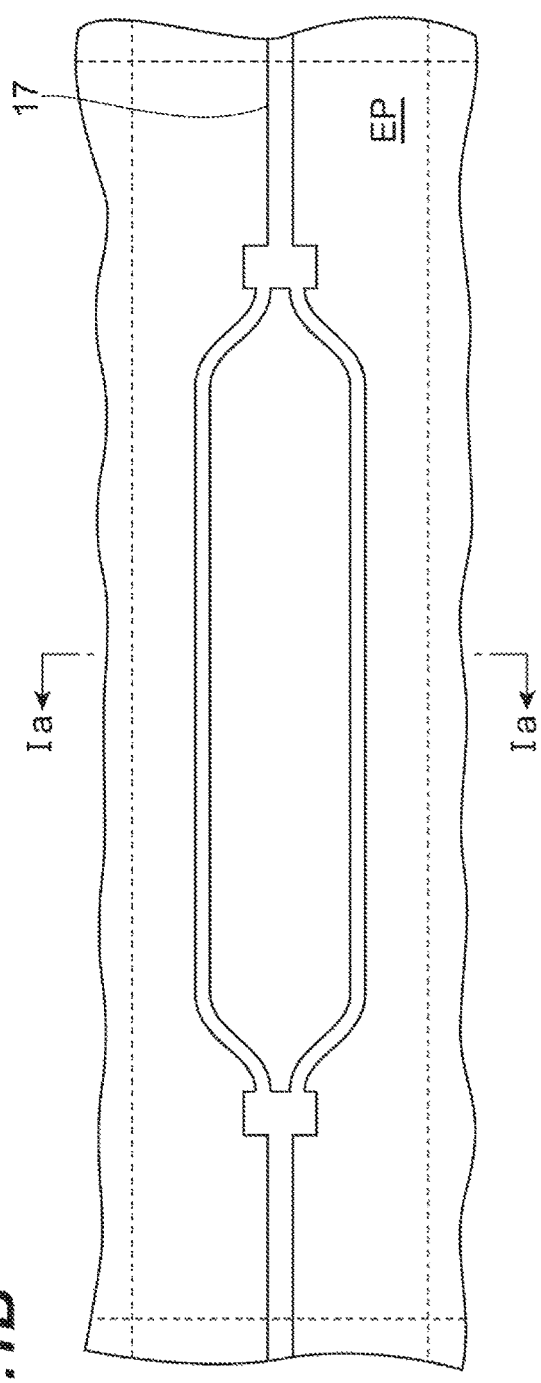

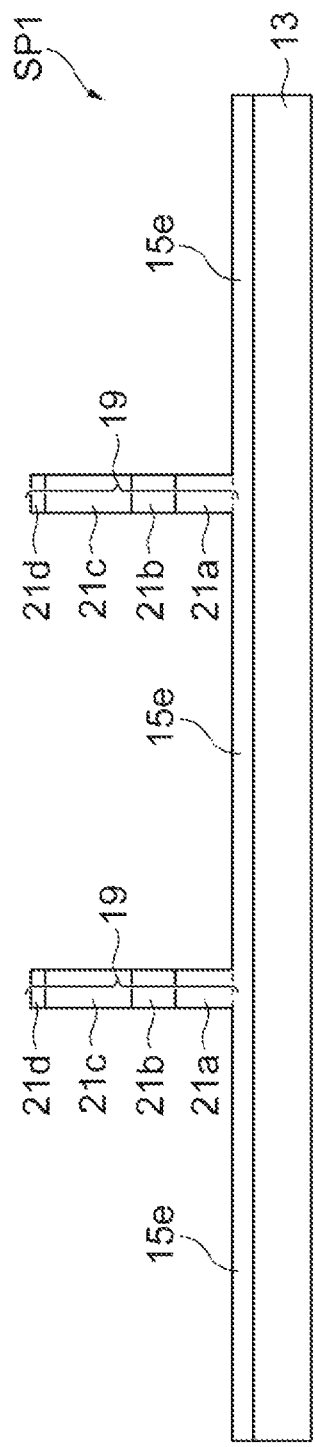
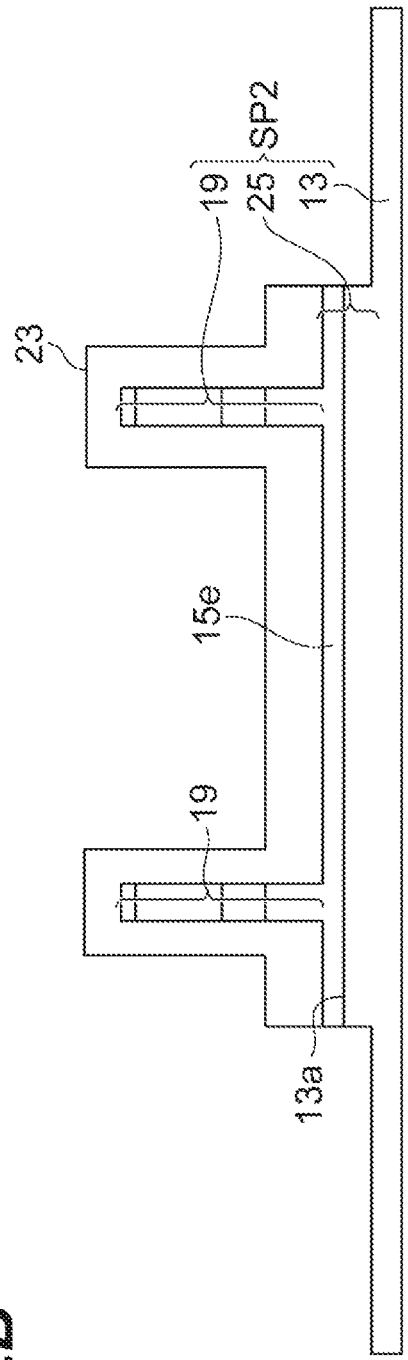

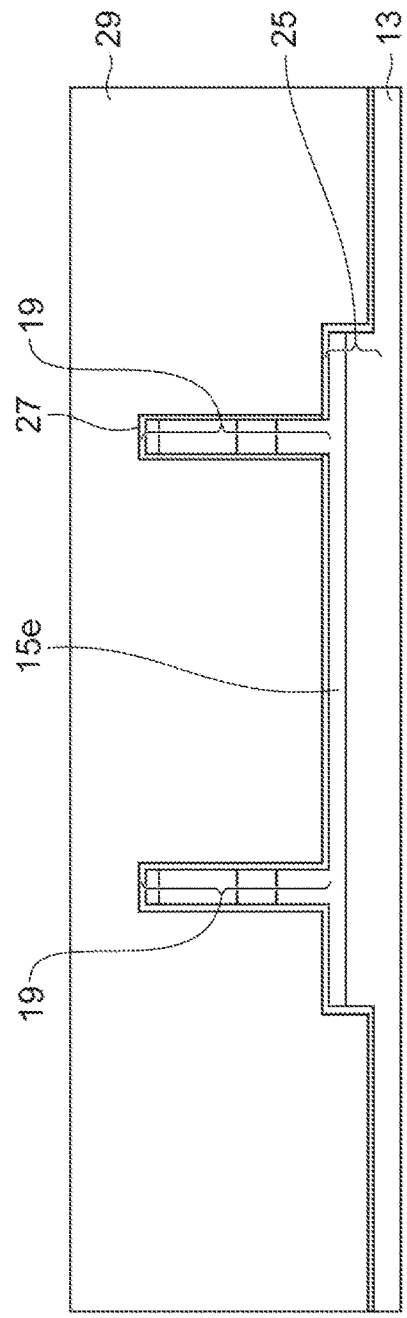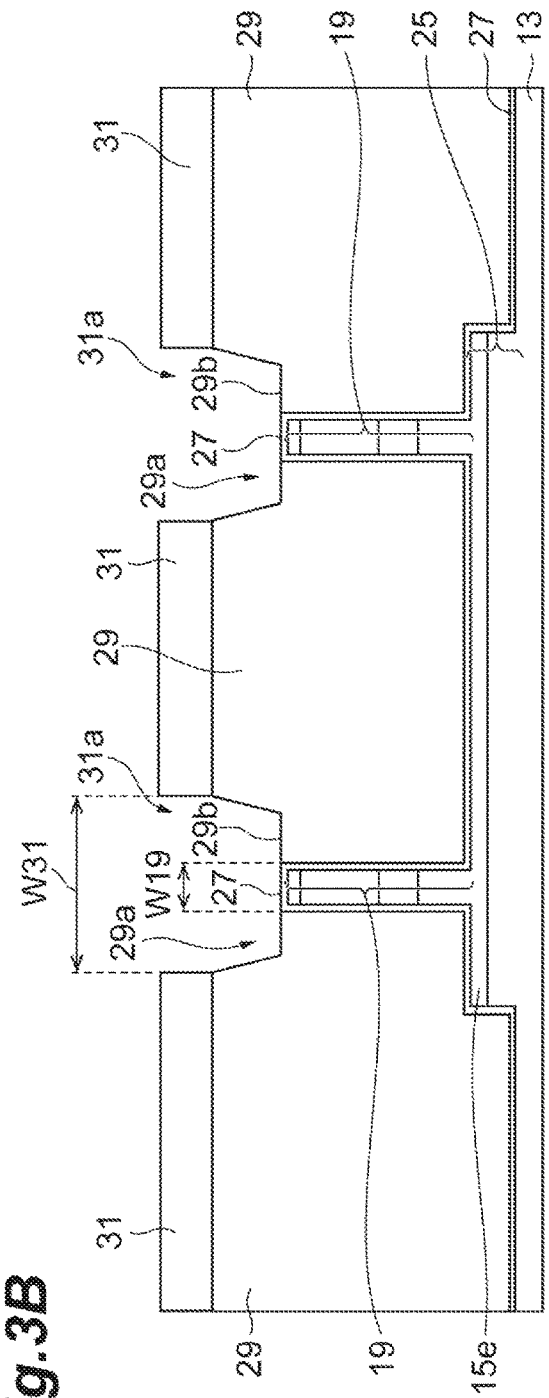
Fig.3A
Fig.3B

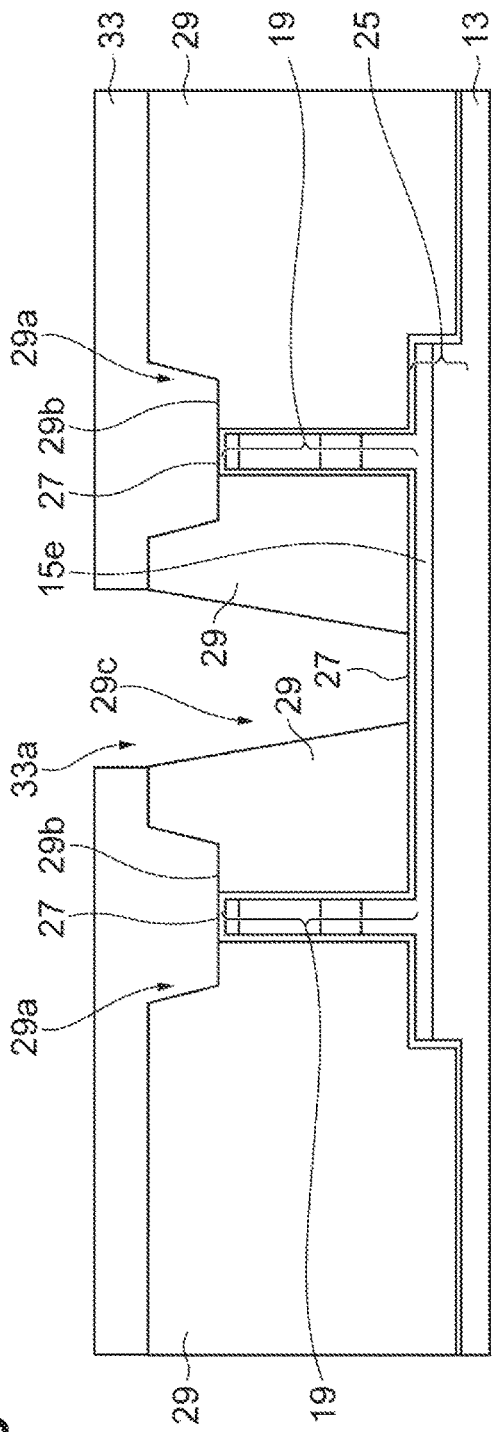
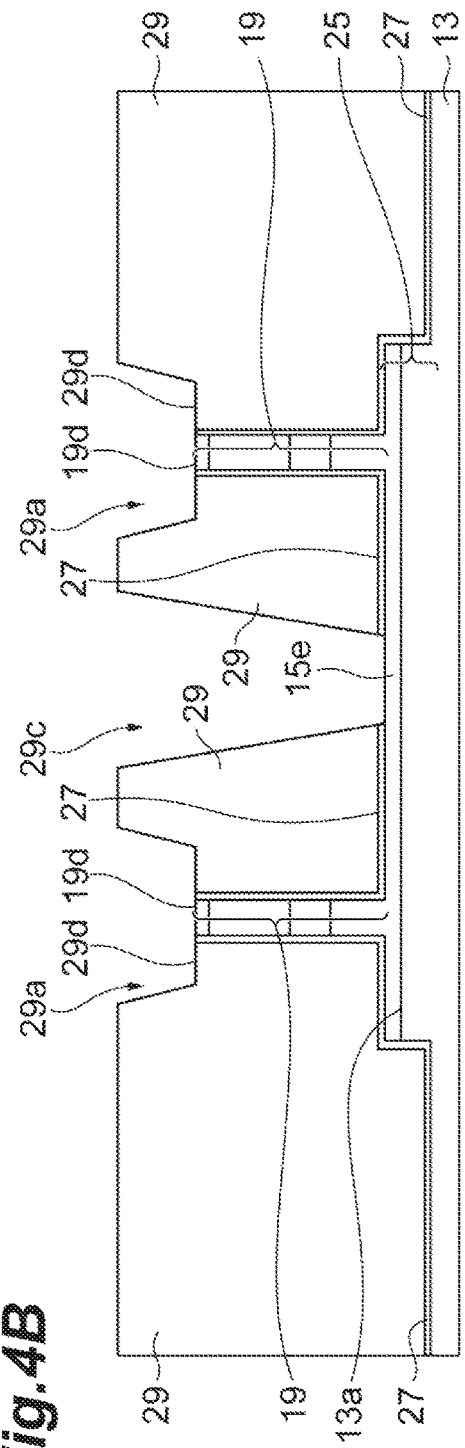
Fig.4A
Fig.4B

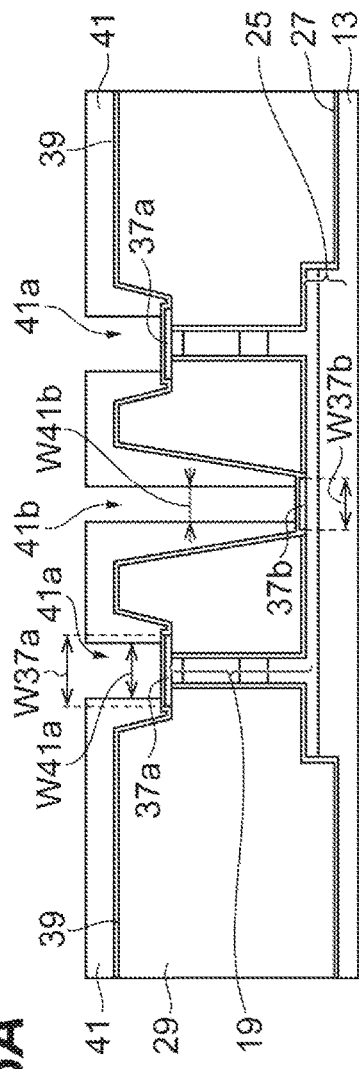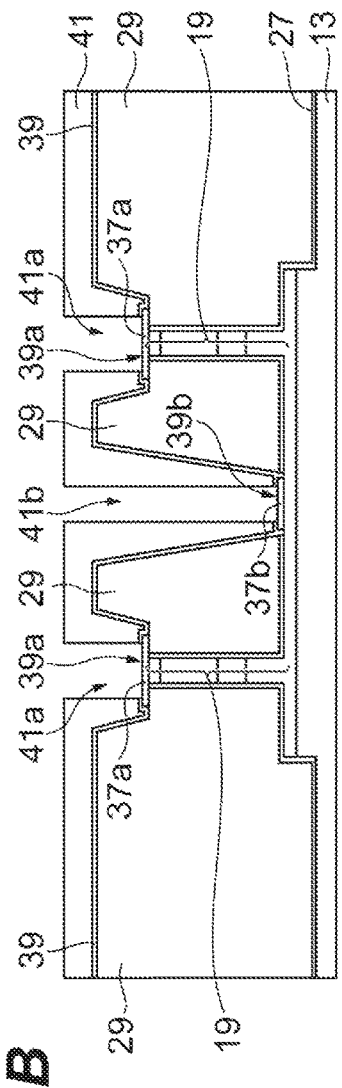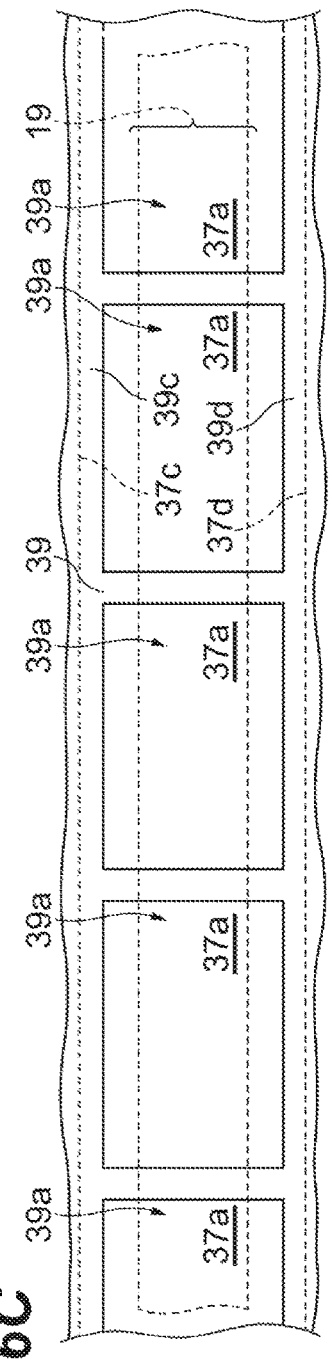

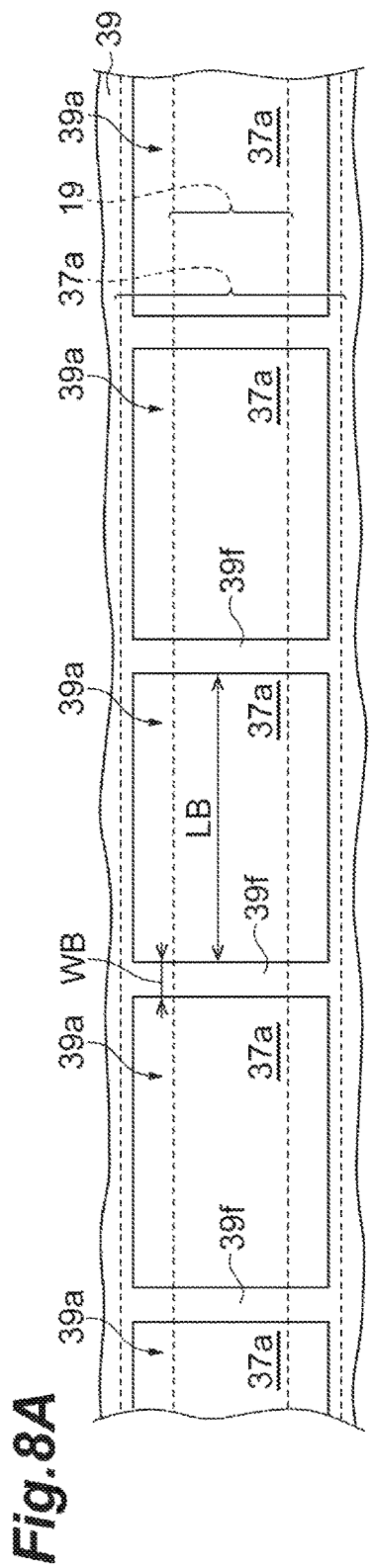# 
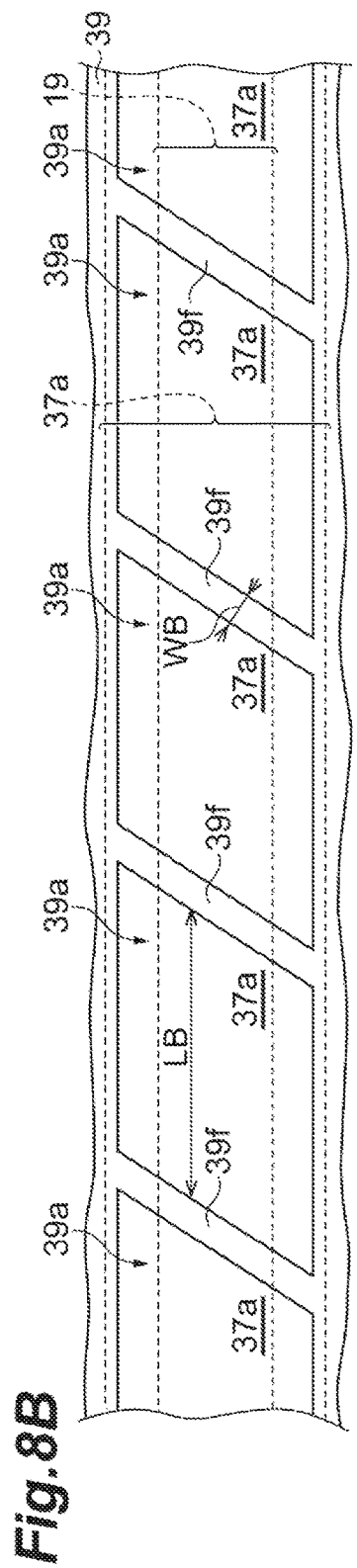
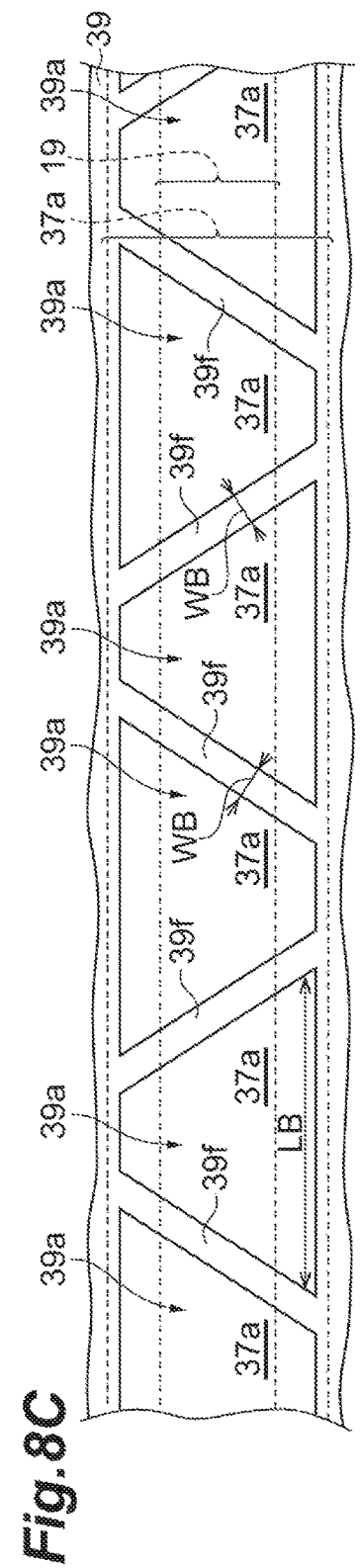
Fig. 8A
Fig. 8B
Fig. 8C

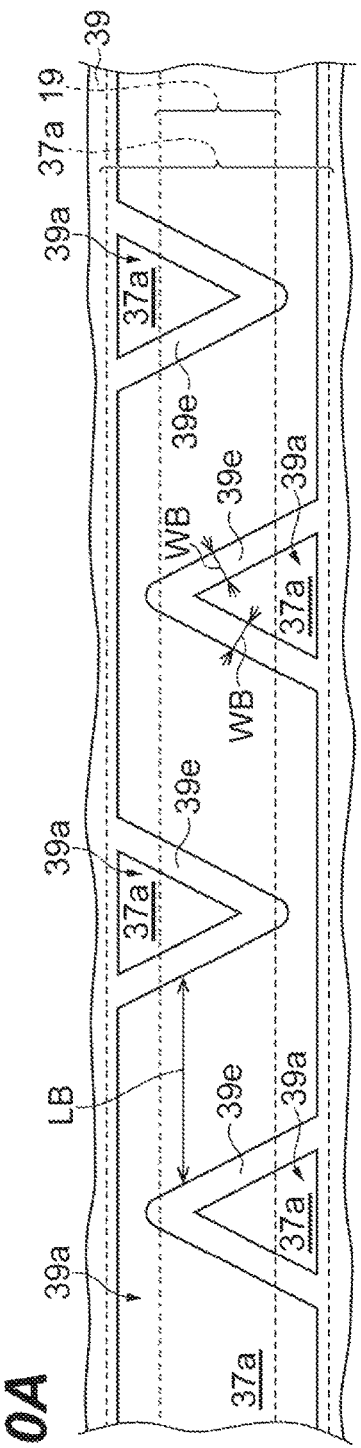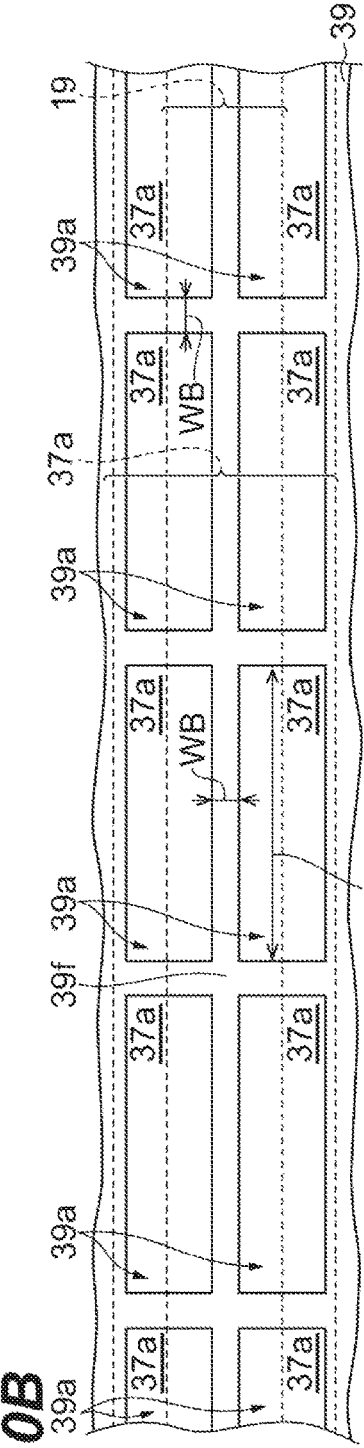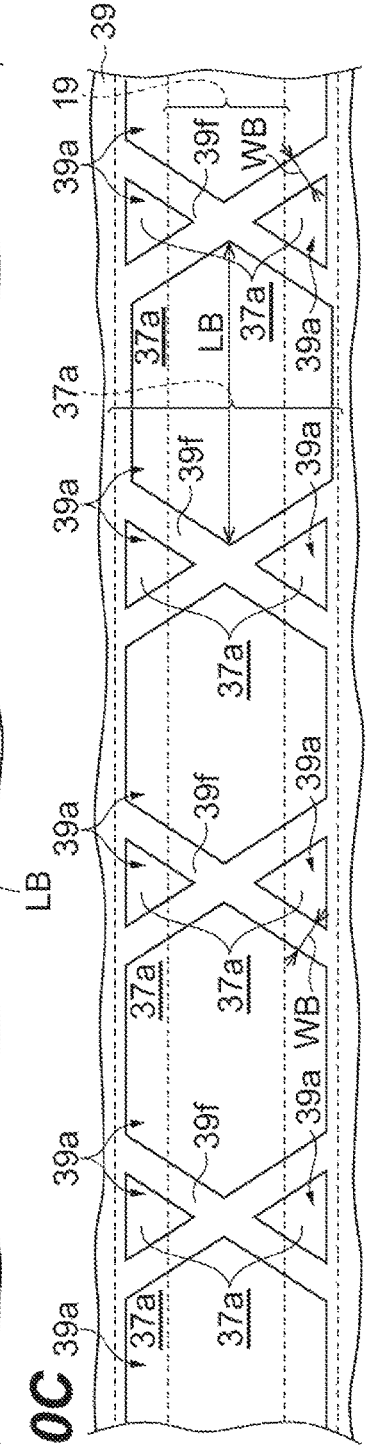

METHOD FOR FABRICATING MACH-ZEHNDER MODULATOR, MACH-ZEHNDER MODULATOR

BACKGROUND OF THE INVENTION

Field of the Invention

The present invention relates to a Mach-Zehnder modulator, and a method for fabricating a Mach-Zehnder modulator. This application claims the benefit of priority from Japanese Patent application No. 2017-019589 filed on Feb. 6, 2017, which is herein incorporated by reference in its entirety.

Related Background Art

Patent Document 1 (Japanese Unexamined Patent Application Publication No. 2013-183026) discloses a bonding pad electrode.

SUMMARY OF THE INVENTION

A method for fabricating a Mach-Zehnder modulator according to one aspect of the present invention includes: forming a resin body embedding a semiconductor mesa for an arm waveguide, the resin body having an opening on an upper face of the semiconductor mesa; forming an electrode on the semiconductor mesa and the resin body, the electrode being in contact with the upper face of the semiconductor mesa through the opening of the resin body; forming an inorganic insulating protective layer on the electrode and the resin body, the inorganic insulating protective layer having multiple first openings on the electrode and the upper face of the semiconductor mesa; and (d) forming a metal body on the inorganic insulating protective layer and the electrode, the metal body being in contact with the electrode through the multiple first openings of the inorganic insulating protective layer.

An Mach-Zehnder modulator according to another aspect of the present invention includes: a semiconductor mesa for an arm waveguide; a resin body embedding the semiconductor mesa and having an opening on a top face of the semiconductor mesa; an electrode extending along the semiconductor mesa on the resin body and the semiconductor mesa and being in contact with the top face of the semiconductor mesa through the opening of the resin body; an inorganic insulating protective layer disposed on the electrode and the resin body and having multiple openings disposed on the electrode and the top face of the semiconductor mesa; and a metal body disposed on the inorganic insulating protective layer, the metal body being in contact with the electrode through the multiple openings of the inorganic insulating protective layer.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 1A is a schematic cross-sectional view showing a major step for forming a mask in a method for fabricating a Mach-Zehnder modulator according to the present embodiment.

FIG. 1B is a schematic plan view showing the pattern of the mask in the method according to the present embodiment.

FIG. 2A is a schematic cross-sectional view showing an etching step for forming a semiconductor mesa in the method according to the present embodiment.

FIG. 2B is a schematic cross-sectional view showing an etching step for forming a device isolation mesa in the method according to the present embodiment.

FIG. 3A is a schematic cross-sectional view showing an embedding step for forming a resin coating in the method according to the present embodiment.

FIG. 3B is a schematic cross-sectional view showing an etching step for forming an opening in the resin coating in the method according to the present embodiment.

FIG. 4A is a schematic cross-sectional view showing an etching step for forming an contact hole in the resin coating in the method according to the present embodiment.

FIG. 4B is a schematic cross-sectional view showing an etching step for forming another contact hole on the mesa in the method according to the present embodiment.

FIG. 6A is a schematic cross-sectional view showing a process for depositing an inorganic insulating protective film in the step in the method according to the present embodiment.

FIG. 6B is a schematic cross-sectional view showing a process for patterning the inorganic insulating protective film in the method according to the present embodiment.

FIG. 6C is a schematic plan view showing the patterned inorganic insulating protective layer in the method according to the present embodiment.

FIGS. 8A, 8B, and 8C are schematic plan views each showing a patterns of inorganic insulating protective layer applicable to the present embodiment.

FIGS. 10A, 10B, and 10C are schematic plan views each showing a patterns of inorganic insulating protective layer applicable to the present embodiment.

DESCRIPTION OF THE EMBODIMENTS

Figure 5A:
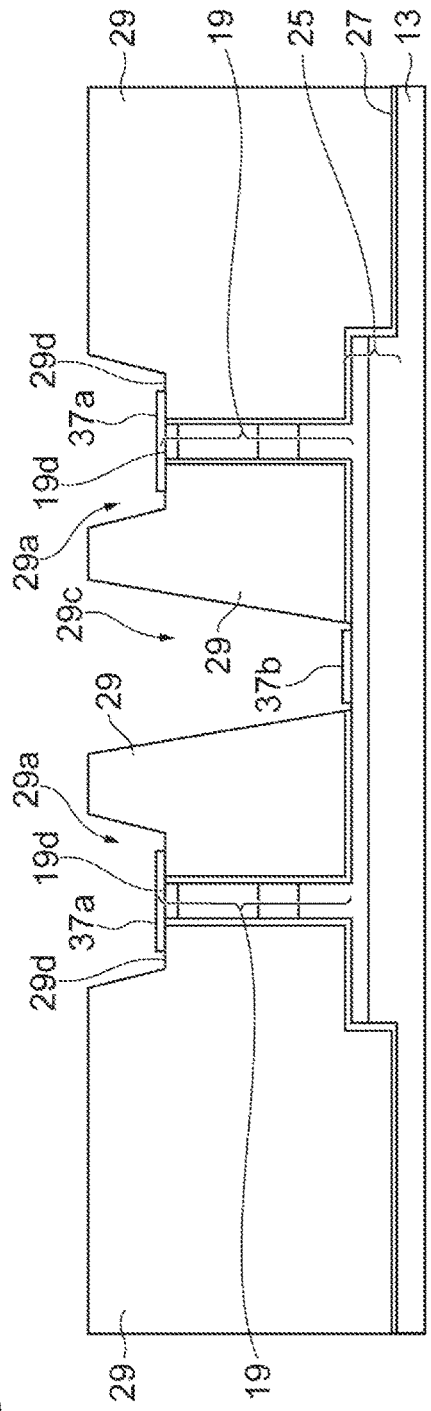
FIG. 5A is a schematic cross-sectional view showing a step for making electrodes in the contact holes in the method according to the present embodiment.

Patent Document 1 discloses an electrode having a surface of titanium enabling high adhesion between an electrode and a silicon oxide.

The method for fabricating a Mach-Zehnder modulator includes the following process. A single opening is formed in an insulating film provided on an electrode in contact with a semiconductor mesa for an arm waveguide and on a resin body embedding the semiconductor mesa, and the single opening of the insulating film is located on the semiconductor mesa. A metal body is formed on the insulating film and the electrode, and the metal body is in contact with the electrode through the single opening. Inventor's studies reveal that the adhesion between the insulating film and an underlying base is deteriorated with the lapse of time after the formation of the insulating film on the underlying layer, and that the deterioration in adhesion facilitates the insulating film to peel off in a pretreatment used in forming the metal body on the insulating film and the electrode. Managing the process time from the formation of an insulating film of an opening to the formation of the metal body is restrictive. What is needed is to eliminate the restriction on the fabricating process. Inventor's further studies reveal that the deterioration of adhesion varies for lots and/or wafers.

It is an object of one aspect of the present invention to provide a method for fabricating a Mach-Zehnder modulator, and the method can solve a problem on variation and deterioration in the adhesion. It is an object of another aspect of the present invention to provide a Mach-Zehnder modulator having a structure that reduces unevenness of electric field applied to the core layer thereof and reduces the variation and deterioration in adhesion to prevent the reduction in yield.

Some embodiments according to the above aspects will be described below.

A method for fabricating a Mach-Zehnder modulator according to an embodiment includes: (a) forming a resin body embedding a semiconductor mesa for an arm waveguide, the resin body having an opening on an upper face of the semiconductor mesa; (b) forming an electrode on the semiconductor mesa and the resin body, the electrode being in contact with the upper face of the semiconductor mesa through the opening of the resin body; (c) forming an inorganic insulating protective layer on the electrode and the resin body, the inorganic insulating protective layer having multiple first openings on the electrode and the upper face of the semiconductor mesa; and (d) forming a metal body on the inorganic insulating protective layer and the electrode, the metal body being in contact with the electrode through the multiple first openings of the inorganic insulating protective layer.

The method for fabricating the Mach-Zehnder modulator provides the inorganic insulating protective layer covering the electrode with not a large single opening but multiple openings, and the multiple openings have one or more sizes each of which are smaller than the size of the large single opening, so that the arrangement of the multiple openings of small sizes are provided on the electrodes. The metal body makes contact with the electrode through the arrangement of the multiple openings on the electrode. Forming the arrangement of the small openings on the electrodes makes it possible to substantially avoid deterioration in adhesion and reduction in yield which are caused by variations between lots and/or between wafers.

In the method according to an embodiment, the electrode has a first edge and a second edge, the first edge and the second edge being disposed on a bottom of the opening of the resin body, and each of the first openings of the inorganic insulating protective layer is defined by a first covering portion and a second covering portion, the first covering portion and the second covering portion cover the first edge and the second edge, respectively.

The method for fabricating the Mach-Zehnder modulator can provide the inorganic insulating protective layer with the first and second edges located on the upper face of the electrode. The small multiple openings are arranged on the flat top face of the electrode.

In the method according to an embodiment, the inorganic insulating protective layer has a first bridge separating one of the multiple first openings from another thereof, and the first bridge extends from one edge of a first edge of the first covering portion and a second edge of the second covering portion and returns to the one edge, and the metal body is disposed on the first bridge.

The method of fabricating the Mach-Zehnder modulator can form the inorganic insulating protective layer with one or more first bridge defining the multiple openings on the upper face of the electrode.

In the method according to an embodiment, the inorganic insulating protective layer has a second bridge separating one of the multiple first openings from another thereof, and the second bridge extends from one edge of a first edge of the first covering portion and a second edge of the second covering portion and returns to another edge thereof, and the metal body is disposed on the second bridge.

The method for fabricating the Mach-Zehnder modulator can form the inorganic insulator protective layer with one or more second bridges defining the multiple openings on the upper face of the electrode.

In the method according to an embodiment, the inorganic insulating protective layer has a first bridge separating one of the multiple first openings from another thereof, and the first bridge extends from one edge of a first edge of the first covering portion and a second edge of the second covering portion and returns to another edge thereof, and the metal body is disposed over the first bridge.

The method for fabricating the Mach-Zehnder modulator can form the inorganic insulator protective layer with one or more first bridges defining multiple openings on the upper face of the electrode.

In the method according to an embodiment, the inorganic insulating protective layer includes a silicon oxide film.

The method for fabricating a Mach-Zehnder modulator forms the arrangement of the multiple openings on the upper face of the electrode, and the arrangement makes it possible to relax the restriction in the inorganic insulating protective layer including a silicon oxide film.

In the method according to an embodiment, the resin body includes a BCB resin.

The method for fabricating the Mach-Zehnder modulator forms the arrangement of the openings on the upper face of the electrode, and the arrangement makes it possible to relax the restriction in the inorganic insulating film on the BCB resin.

An Mach-Zehnder modulator according to an embodiment includes: (a) a semiconductor mesa for an arm waveguide; (b) a resin body embedding the semiconductor mesa and having an opening on a top face of the semiconductor mesa; (c) an electrode extending along the semiconductor mesa on the resin body and the semiconductor mesa and being in contact with the top face of the semiconductor mesa through the opening of the resin body; (d) an inorganic insulating protective layer disposed on the electrode and the resin body and having multiple openings on the electrode and the top face of the semiconductor mesa; and (e) a metal body disposed on the inorganic insulating protective layer, the metal body being in contact with the electrode through the multiple openings of the inorganic insulating protective layer.

In the Mach-Zehnder modulator, the inorganic insulating protective layer on the electrode and the resin body has an arrangement of the multiple openings on the electrode. The metal body makes contact with the electrode through the array of the multiple openings of the inorganic insulating protective layer. The structure that allows the single metal body to be connected to the electrode has an arrangement of the multiple openings. This arrangement can reduce the non-uniformity of electric field applied to the core layer of the arm waveguide of the Mach-Zehnder modulator to avoid the problem on the yield associated with the inorganic insulating protective layer in processes for fabricating the Mach-Zehnder modulator.

Teachings of the present invention can be readily understood by considering the following detailed description with reference to the accompanying drawings shown as examples. Referring to the accompanying drawings, a method for fabricating a Mach-Zehnder modulator and a Mach-Zehnder modulator according to the present embodiments will be described below. To facilitate understanding, identical reference numerals are used, where possible, to designate identical elements that are common to the figures.

FIG. 1A is a schematic view showing a single device section of a Mach-Zehnder modulator to be fabricated. Referring to FIG. 1A, an epitaxial substrate EP is prepared. In the present embodiment, in order to prepare the epitaxial substrate EP, the epitaxial substrate EP is fabricated. For example, the epitaxial substrate EP is fabricated as follows. A substrate 13, such as a semiconductor wafer, is prepared, and a semiconductor laminate 15 for a semiconductor waveguide is grown on the principal surface 13a of the substrate 13. This crystal growth is performed, for example, by a metal organic vapor phase epitaxy or a molecular beam epitaxy. The semiconductor laminate 15 includes a first semiconductor layer 15a for a lower cladding layer, a second semiconductor layer 15b for a core layer, a third semiconductor layer 15c for an upper cladding layer, and a fourth semiconductor layer 15d for a contact layer. Each of the first semiconductor layer 15a, the second semiconductor layer 15b, the third semiconductor layer 15c, and the fourth semiconductor layer 15d includes a III-V compound semiconductor.

Substrate 13: semi-insulating InP.
Exemplary semiconductor laminate 15.
First semiconductor layer 15a: n-type InP.
Second semiconductor layer 15b: AlGaInAs/AlInAs multiple quantum wells.
Third semiconductor layer 15c: p-type InP.
Fourth semiconductor layer 15d: p-type InGaAs.

As shown in FIGS. 1A and 1B, a first mask 17 is formed on the epitaxial substrate EP by photolithography and etching. FIG. 1A is a cross sectional view taken along Ia-Ia line shown in FIG. 1B. The first mask 17 has a pattern defining a semiconductor mesa for a semiconductor waveguide of the Mach-Zehnder modulator as shown in FIG. 1B. The first mask 17 includes a silicon-based inorganic insulating film, such as SiN.

As shown in FIG. 2A, the semiconductor laminate 15 in the epitaxial substrate EP is etched with the first mask 17 to form a semiconductor mesa 19 for the optical waveguide of the Mach-Zehnder modulator. The etching is performed by dry etching and/or wet etching. The dry etching may use an etchant, such as a halogen-based gas. The semiconductor mesa 19 includes a lower cladding layer 21a, a core layer 21b, an upper cladding layer 21c, and a contact layer 21d. The lower cladding layer 21a, the core layer 21b, the upper cladding layer 21c, and the contact layer 21d are arranged in the direction normal to the principal surface 13a. After the etching is completed, the first mask 17 is removed to obtain a first product SP1. The first product SP1 includes the conductive semiconductor layer 15e left on the substrate 13, and the semiconductor mesa 19 is disposed on the conductive semiconductor layer 15e produced from the first semiconductor layer 15a.

As shown in FIG. 2B, a device isolation mesa is formed in the first product SP1. The device isolation mesa 25 defines the region of the conductive semiconductor layer 15e left on the substrate 13. A second mask 23 is formed by photolithography and etching on the substrate 13, specifically, on the first product SP1. FIG. 2A is a schematic cross-sectional view showing the progress of a structure that has a cross section taken along line Ia-Ia shown in FIG. 1B. The second mask 23 has a pattern that defines the device isolation mesa 25, which is integrated with the lower cladding layer 21a of the optical waveguide in the Mach-Zehnder modulator. The second mask 23 may include a silicon-based inorganic insulating film, such as SiN. After the etching is completed, the second mask 23 is removed to obtain a second product SP2.

As shown in FIG. 3A, an inorganic insulating film 27 and a resin body 29 are formed on the second product SP2. The inorganic insulating film 27, such as a silicon-based inorganic insulating film, is grown on the second product SP2. The inorganic insulating film 27 covers the top and side faces of the semiconductor mesa 19, the top face of the conductive semiconductor layer 15e, and the principal surface of the substrate 13. This growth is carried out by, for example, a chemical vapor deposition (CVD). The resin body 29 is formed on the inorganic insulating film 27, and may include, for example, benzocyclobutene (BCB). An exemplary method for forming the resin body 29 is as follows: BCB resin is applied thereon; and the BCB resin thus is cured by heat treatment.

As shown in FIG. 3B, a third mask 31 is formed thereon, and the third mask 31 thus formed is used to form the first opening 29a in the resin body 29. The third mask 31 has an opening 31a aligned with the top face of the semiconductor mesa 19. The opening 31a has a width W31 larger than the mesa width W19 of the semiconductor mesa 19. The third mask 31 may be made of, for example, resist. The resin body 29 is etched with the third mask 31 to form the first opening 29a in the resin body 29. The etchant includes, for example, $CF_4$ and $O_2$. The inorganic insulating film 27 on the face 29b of the resin body and the top face of the semiconductor mesa 19 appears at the first opening 29a of the resin body, and forms the bottom face of the first opening 29a. After the etching is completed, the third mask 31 is removed.

As shown in FIG. 4A, a fourth mask 33 is formed thereon, and the fourth mask 33 thus formed is used to form a second opening 29c in the resin body 29. The fourth mask 33 has an opening 33a, which is aligned with the top face of the conductive semiconductor layer 15e extending from one of the two semiconductor mesas 19 for the arm waveguides to the other. The fourth mask 33 can be made of, for example, resist. The resin body 29 is etched with the fourth mask 33 to form the second opening 29c in the resin body 29. The etchant includes, for example, $CF_4$ and $O_2$. The inorganic insulating film 27 on the top face of the conductive semiconductor layer 15e appears at the second opening 29c, and forms a bottom of the second opening. After the etching is completed, the fourth mask 33 is removed.

The above etching steps can provide the resin body 29 embedding the semiconductor mesa 19 for the arm waveguide with both the second opening 29c and the first opening 29a, which is located on the upper face 19d of the semiconductor mesa 19.

After the fourth mask 33 is removed, as shown in FIG. 4A, the resin body 29 thus etched are disposed on the substrate 13, the semiconductor mesas 19, and the device isolation mesa 25, and is provided with the first and second openings 29a and 29c at which the inorganic insulating film 27 and the resin body 29 appear. The inorganic insulating film 27 in the first and second openings 29a and 29c is to be selectively removed to expose the underlying semiconductor. The removal of the inorganic insulating film 27 is carried out by plasma treatment. The plasma treatment uses, for example, $CF_4$ gas as etchant. After the plasma treatment, the upper face 19d of the semiconductor mesa 19 and the etched resin body 29d appear in the first opening 29a, and the top face of the conductive semiconductor layer 15e in the device isolation mesa 25 appears in the second opening 29c. The second opening 29c has a depth larger than that of the first opening 29a.

As shown in FIG. 5A, a first electrode 37a is formed in the first opening 29a on the etched resin body 29d and the upper face 19d of the semiconductor mesa 19, and a second electrode 37b is formed on the conductive semiconductor layer 15e in the second opening 29c. The metal layers for the first and second electrodes 37a and 37b are formed, for example, by lift-off, and an exemplary process for lift-off is as follows: forming a lift-off mask; depositing a metal film on the wafer; removing the lift-off mask to form the patterned metal film.

First electrode 37a: TiPtAu.
Second electrode 37b: AuGeNiAu.
Material of top layer of electrodes (37a and 37b): Au.
The first electrode 37a makes contact with the top face 19d of the semiconductor mesa 19, and the second electrode 37b makes contact with the top of the conductive semiconductor layer 15e in the device isolation mesa 25.

These processes can form the first electrode 37a, which is direct contact with the top 19d of the semiconductor mesa 19 through the first opening 29a of the resin body 29, on the etched resin body 29d and each of the semiconductor mesas 19 so as to extend along each semiconductor mesa 19, and can also form the second electrode 37b, which is in direct contact with the top of the conductive semiconductor layer 15e through the second opening 29c of the resin body 29, on the conductive semiconductor layer 15e located between the two semiconductor mesas 19.

Figure 5B:
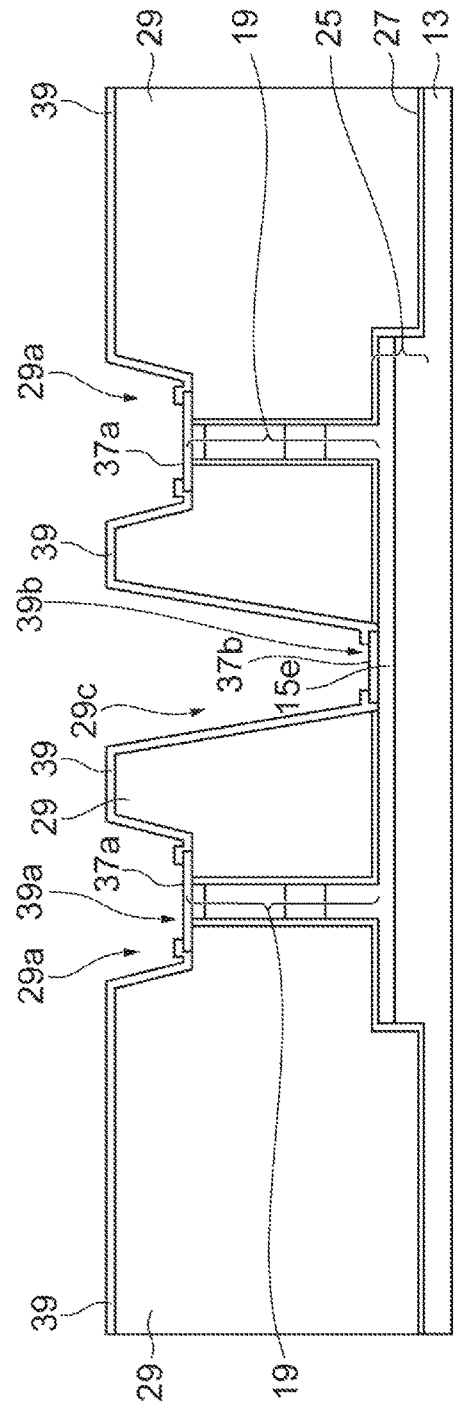
FIG. 5B is a schematic cross-sectional view showing a step for forming an inorganic insulating protective layer in the method according to the present embodiment.

After the first electrode 37a is formed, as shown in FIG. 5B, an inorganic insulating protective layer 39 is formed which covers the outward surface of the resin body 29. The inorganic insulator protective layer 39 has multiple first openings 39a on the first electrode 37a and a second opening 39b on the second electrode 37b. The inorganic insulating protective layer 39 may include a silicon-based inorganic insulating film, such as silicon oxide and silicon nitride. The inorganic insulator protective layer 39 may have a thickness of 50 to 500 nanometers.

A detail description is given of the formation of the inorganic insulating protective layer 39 with reference to FIGS. 6A, 6B, and 6C. After the formation of the first and second electrodes 37a and 37b, as shown in FIG. 6A, a silicon-based inorganic insulating film, such as silicon oxide or silicon nitride, for the inorganic insulating protective layer 39 is formed on the ohmic electrode and the surface of the resin body 29. A fifth mask 41 is formed on the silicon-based inorganic insulating film, and has a pattern with multiple first openings 41a and a second opening 41b. The multiple first openings 41a are arranged in the direction in which the semiconductor mesa 19 extends. The multiple first openings 41a are located along the first electrode 37a, and, the second opening 41b is located on the second electrode 37b. The first openings 41a each have a width W41a smaller than the electrode width W37a of the first electrode 37a, and the second opening 41b has a width W41b smaller than the electrode width W37b of the second electrode 37b. As shown in FIG. 6B, the silicon-based inorganic insulating film is etched with the fifth mask 41 to form the inorganic insulating protective layer 39, which has the first openings 39a and the second opening 39b, so that the inorganic insulator protective layer 39 is provided with the multiple first openings 39a and the second opening 39b, which are disposed on the first electrode 37a on the top face of the semiconductor mesa 19 and the second electrode 37b on the conductive semiconductor layer 15e, respectively. The first electrode 37a appears in each first opening 39a, and the resin body 29 and the inorganic insulating film 27 do not appear in any of the first openings 39a. The second electrode 37b and the inorganic insulating film 27 appear in the second opening 39b, and the resin body 29 does not appear in the second opening 39b. As shown in FIG. 6C, the first openings 39a are arranged on and along the semiconductor mesa 19. The first electrode 37a (the second electrode 37b) has a first edge 37c and a second edge 37d, which are disposed on the bottom face of the first opening 29a (the second opening 29c) of the resin body 29. Each of the first openings 39a of the inorganic insulating protective layer 39 is defined by a first covering portion 39c and a second covering portion 39d, which cover the first and second edges 37c and 37d of the first electrode 37a, respectively. The first and second edges of the inorganic insulating protective layer 39 are disposed on the upper face of the first electrode 37a. The first openings 39a of small size are disposed on the upper face of the flat electrode. If necessary, the second opening 39b of the inorganic insulating protective layer 39 on the second electrode 37b may have a shape and an arrangement which are identical or similar to those of the first openings 39a of the inorganic insulating protective layer 39 on the first electrode 37a.

Figure 7:
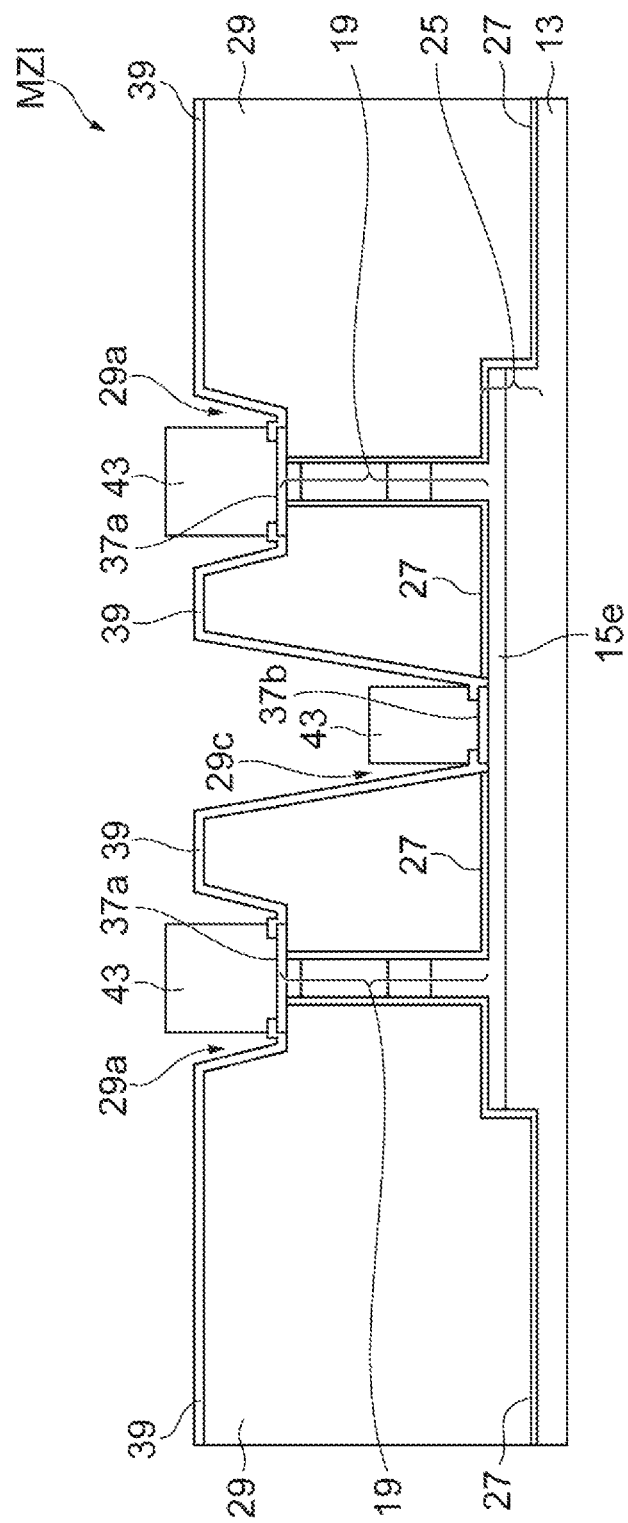
FIG. 7 is a schematic cross-sectional view showing a step for making electrodes in the contact holes in the method according to the present embodiment.
Figure 9A:
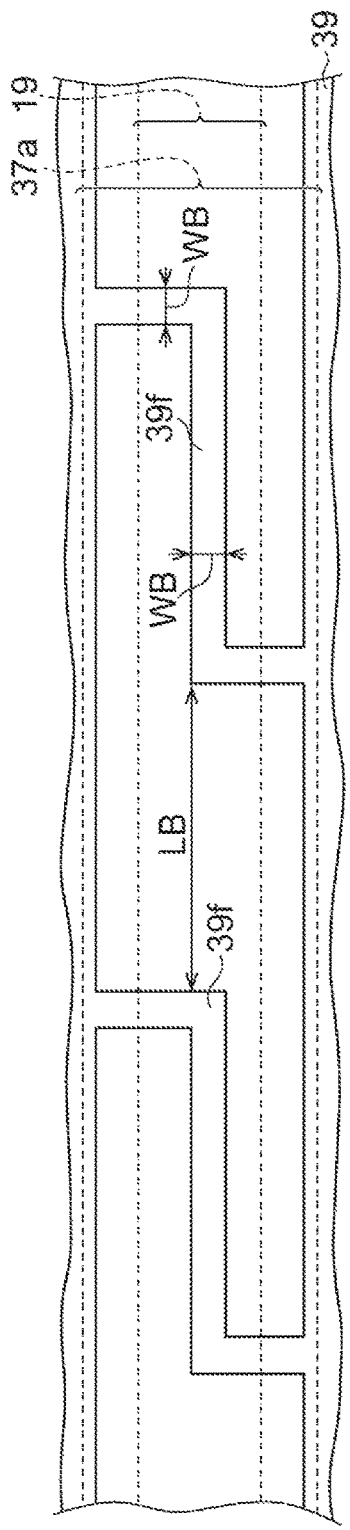
FIGS. 9A and 9B are schematic plan views each showing a patterns of inorganic insulating protective layer applicable to the present embodiment.
Figure 9B:
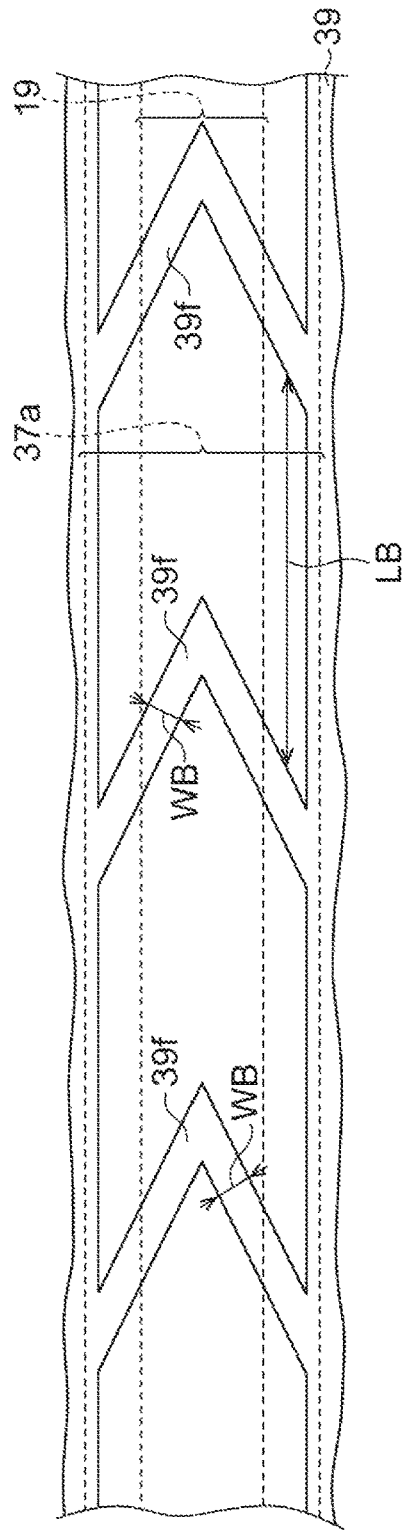

As shown in FIG. 7, metal bodies 43 are formed on the inorganic insulating protective layer 39, the first electrode 37a, and the second electrode 37b. The metal bodies 43 can be produced by, for example, plating and lift-off. The first electrode 37a makes contact with one of the metal bodies 43 through the multiple first openings 39a. The metal body 43 is disposed on the inorganic insulator protective layer 39 that defines the multiple first openings 39a, and is in contact with the inorganic insulator protective layer 39, and is makes contact with the single first electrode 37a through the multiple first openings 39a of the inorganic insulator protective layer 39. The other of the metal bodies 43 makes contact with the single second electrode 37b through the single second opening 39b of the inorganic insulator protective layer 39.

The method for fabricating the Mach-Zehnder modulator MZI includes forming not a single opening but multiple first openings 39a, which are positioned on the first electrode 37a, in the inorganic insulating protective layer 39, and forming the multiple first openings 39a of small size allows each of the first openings 39a to have a size smaller than that of the single opening of large size. These small openings are arranged on the first electrode 37a. The metal body 43 makes contact with the first electrode 37a through the first openings 39a arranged on the first electrode 37a. The arrangement of the small first openings 39a thus formed on the first electrode 37a can substantially avoid deterioration in adhesion and reduction in yield which is caused by variations for individual lots and/or wafers.

The steps as described above bring a Mach-Zehnder modulator to completion, and accordingly the present embodiment provides a method for fabricating a Mach-Zehnder modulator, and the method can eliminate the problem associated with deterioration of adhesion and variations thereof. The present embodiment also provides the Mach-Zehnder modulator having a structure that can overcome the problem associated with the deterioration and variation in adhesion to avoid decrease in yield caused by the adhesion matter.

As shown in FIG. 7, the Mach-Zehnder modulator MZI includes the semiconductor mesa 19 for an arm waveguide, the resin body 29, the first electrode 37a, the inorganic insulator protection layer 39, and the metal bodies 43. The resin body 29 embeds the semiconductor mesa 19 and has first openings 29a on the top of the semiconductor mesa 19. The first electrode 37a extends on the resin body 29 and the semiconductor mesa 19 along the semiconductor mesa 19, and makes contact with the top of the semiconductor mesa 19 through the first openings 29a of the resin body 29. The inorganic insulator protecting layer 39 is disposed on the first electrode 37a and the resin body 29, and has multiple first openings 39a on the top of the semiconductor mesa 19 and the first electrode 37a. The metal body 43 is disposed in direct contact with the inorganic insulator protective layer 39, and makes contact with the first electrode 37a through the multiple first openings 39a thereof.

The Mach-Zehnder modulator MZI provides the inorganic insulating protective layer 39 on the first electrode 37a and the resin body 29 with an arrangement of the multiple first openings 39a located on the first electrode 37a. The metal body 43 makes contact with the first electrode 37a through an arrangement of the multiple first openings 39a. The structure allowing the connection of the single metal body 43 with the single first electrode 37a also provides the inorganic insulator protective layer 39 with an arrangement of multiple edges that define the multiples first openings 39a. This arrangement also provides the Mach-Zehnder modulator MZI with a structure that can avoid yield-related problems caused by the inorganic insulating protective layer 39 in the fabrication of the Mach-Zehnder modulator MZI.

The Mach-Zehnder modulator MZI includes the second electrode 37b and another metal body 43. The second opening 29c of the resin body 29 on the conductive semiconductor layer 15e is positioned between the semiconductor mesas 19 for the two arm waveguides. The second electrode 37b extends on the conductive semiconductor layer 15e and the resin body 29 between the semiconductor mesas 19 for the two arm waveguides, and is electrically connected to the conductive semiconductor layer 15e. The inorganic insulating protective layer 39 is disposed on the second electrode 37b and the resin body 29, and may have at least one second opening 39b on the conductive semiconductor layer 15e and the second electrode 37b. The other metal body 43 makes contact with the second electrode 37b through the second opening 39b of the inorganic insulating protective layer 39.

FIGS. 8A, 8B and 8C, 9A and 9B, and 10A, 10B, and 10C each show a pattern of the inorganic insulating protective layer applicable to the present embodiment. In each of FIGS. 8A to 10C, the metal body 43 connected to the first electrode 37a is omitted to draw the shape of the inorganic insulating protective layer 39 by a solid line. FIG. 8A shows an electrode structure in the Mach-Zehnder modulator MZI, which is fabricated with the pattern shown in FIG. 6C.

The mask pattern applicable to the present method and the electrode structure applicable to the Mach-Zehnder modulator MZI are not limited to the specific shapes shown in FIGS. 6C and 8A, respectively.

The inorganic insulator protection layer 39 has one or more first bridges 39e that separate one of the multiple first openings 39a from another thereof. The first bridges 39e each start from one edge of the first edge of the first covering portion 39c and the second edge of the second covering portion 39d, and returns to the one edge. The metal body 43 is disposed on the first bridges 39e, and extends beyond the first bridges 39e from one of the multiple first openings 39a to an adjacent first opening 39a. The inorganic insulator protection layer 39 may have the multiple first openings 39a, which the first bridges 39e form on the upper face of the first electrode 37a.

The inorganic insulator protection layer 39 has one or more second bridges 39f that separates one of the multiple first openings 39a from anther thereof. The second bridges 39f start from one edge of the first edge of the first covering portion 39c and the second edge of the second covering portion 39d, and returns to the other edge. The metal body 43 is disposed on the second bridges 39f, and extends beyond the second bridges 39f from one of the multiple first openings 39a to an adjacent first opening 39a. The inorganic insulator protection layer 39 may have the multiple first openings 39a, which the second bridges 39f form on the upper face of the first electrode 37a.

FIGS. 8B and 8C, and FIGS. 9A and 9B each illustrate the structure and arrangement of the second bridges 39f. FIG. 10A illustrates the structure and arrangement of the first bridges 39e. The first bridges 39e of FIG. 10A are disposed along each of the first and second edges of the inorganic insulating protective layer 39. The first bridges 39e may be, however, disposed along one of the first and second edges of the inorganic insulating protective layer 39. FIGS. 10B and 10C each illustrate the structure and arrangement of the first and second bridges 39e and 39f.

Figure 11:
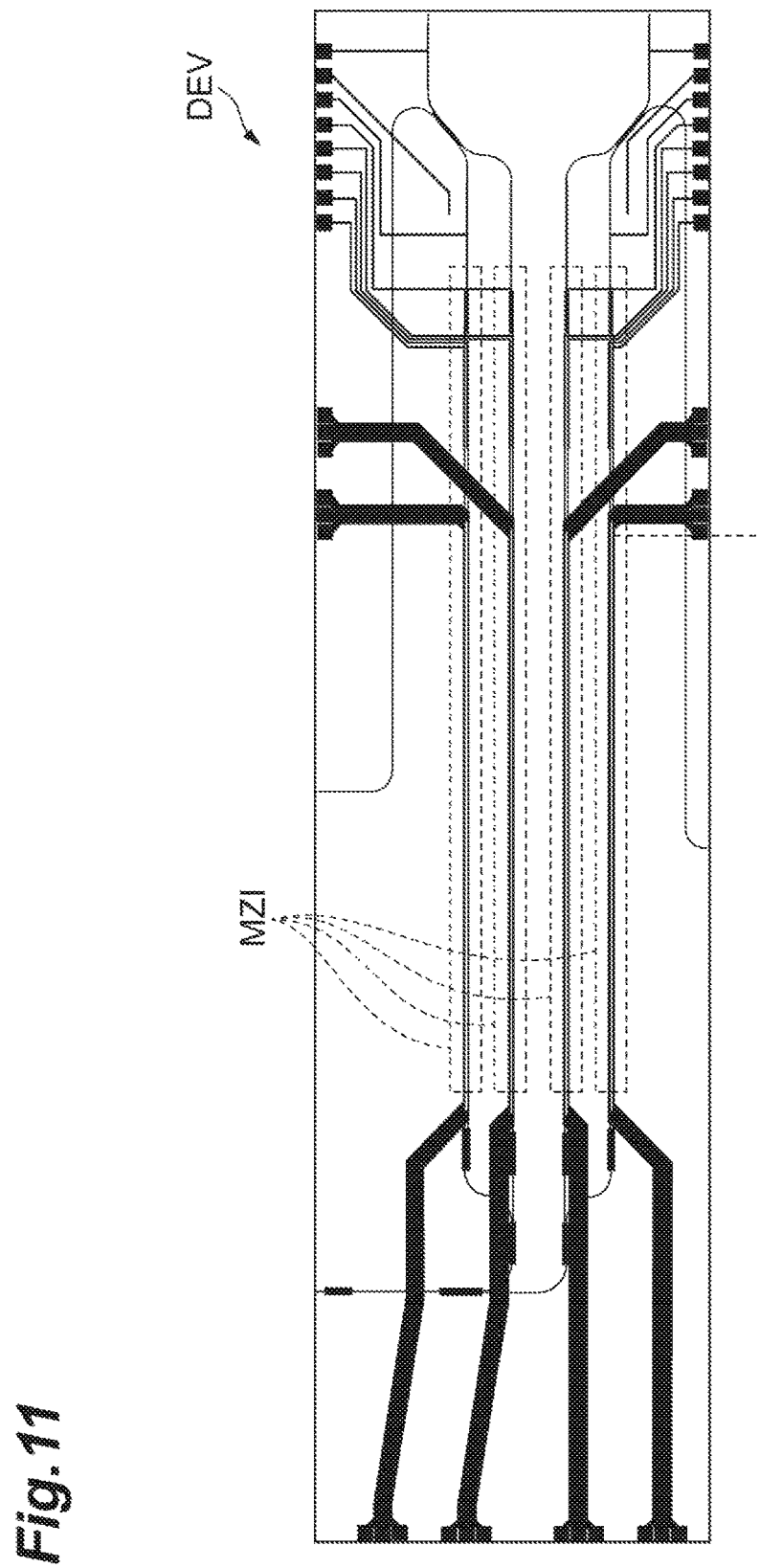
FIG. 11 is a plan view showing a semiconductor device including the Mach-Zehnder modulators as shown in FIG. 7.

FIG. 11 is a plan view showing a semiconductor device DEV including the Mach-Zehnder modulator MZI shown in FIG. 7. The semiconductor device DEV includes, for example, four Mach-Zehnder modulators MZI.

Example

Figure 12:
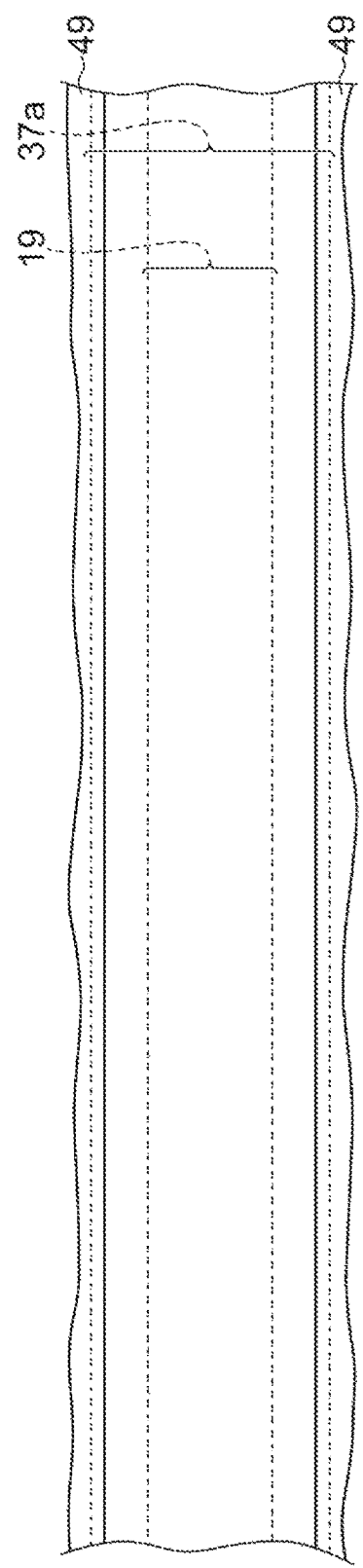
FIG. 12 is a schematic plan view showing a pattern of an inorganic insulating protective layer having a single opening on a semiconductor mesa, and a first electrode.

FIG. 12 is a view showing the inorganic insulator protective layer 49 having a single opening on the semiconductor mesa 19 and the first electrode 37a. The shape and arrangement of the openings of the inorganic insulating protective layer 39 according to the present embodiment can relax the restriction on elapse time after obtaining the patterned inorganic insulating protective layer 39 and before forming the metal body 43 thereon, compared to the inorganic insulating protective layer 49 patterned as shown in FIG. 12. Inventors' experiments reveal that the product that is obtained by forming the metal body 43 after 100 hours of forming the patterned inorganic insulator protective layer 39 does not exhibit peeling of the inorganic insulator protective layer 39, but that the product that is obtained by forming the metal body 43 after one hour of forming the patterned inorganic insulating protective layer 49 exhibits peeling of the inorganic insulating protective layer 39.

Material of resin body 29: BCB resin.
Materials of the inorganic insulator protection layers 39 and 49: silicon oxide film.
Thickness of inorganic insulating protective layers 39 and 49: 300 nm
Material of top layer of electrodes (37a and 37b): Au.

The width ("WB" shown in FIG. 8A) of the first and second bridges 39e and 39f can be, for example, 0.5 micrometers or more, and the first and second bridges 39e and 39f of less than 0.5 micrometers in width does not have strength of the film enough to avoid the peeling-off. The width of the first and second bridges 39e and 39f can be, for example, 10 micrometers or less, and the first and second bridges 39e and 39f of more than 10 micrometers in width may cause non-uniformity in electric field applied to the core layer. The openings provided by the first and second bridges 39e and 39f may have a length ("LB" shown in FIG. 8A) of, for example, 5.0 micrometers or more, and the length of 5.0 micrometers or less hinders high frequency current from flowing to the semiconductor mesa. Preferably, the length LB is 10 times as large as or more than the width WB. Inventors' studies have found that the Mach-Zehnder modulator MZI does not cause a steady current to flow through the arm waveguide but that the bridges cause difference in voltage drop between the presence and absence of the bridges to lead to non-uniformity in the electric field applied to the core layer. Inventors' estimate shows that the first openings 39a having an interval WB of 30 micrometers or more can suppress a voltage drop immediately below the inorganic insulating protective layer 39. The structure and arrangement of the first bridges 39e and/or the second bridges 39f can reduce non-uniformity of the electric field applied to the core layer, and can prevent the modulation band of the Mach-Zehnder modulator MZI from deteriorating.

Specifically, the arrangement of the first openings 39a (the second openings 39b) on the upper face of the first electrode 37a (the second electrode 37b) can remove the restriction on the inorganic insulating protective layer 39 including the silicon oxide film (the upper limit time after formation of the patterned inorganic insulating protective layer 39 before formation of the metal body 43). In addition, the arrangement of the first openings 39a (the second opening 39b) on the upper face of the first electrode 37a (the second electrode 37b) makes it possible to alleviate the above restriction in the inorganic insulating protective layer 39 on the BCB resin.

The above description given on the present embodiment shows that the method for fabricating the Mach-Zehnder modulator can solve the problem associated with the deterioration and variation in the adhesion and avoid the non-uniformity of the electric field to the core layer, and provides a Mach-Zehnder modulator with a structure that can reduce non-uniformity of the electric field applied to the core layer to overcome the deterioration and the variation in the adhesiveness, thereby avoiding decrease in yield arising from poor adhesiveness.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A method for fabricating a Mach-Zehnder modulator comprising:
   forming a resin body embedding a semiconductor mesa for an arm waveguide, the resin body having an opening on an upper face of the semiconductor mesa;
   forming an electrode on the semiconductor mesa and the resin body, the electrode being in contact with the upper face of the semiconductor mesa through the opening of the resin body;
   forming an inorganic insulating protective layer on the electrode and the resin body, the inorganic insulating protective layer having an arrangement of multiple first openings therethrough to the electrode; and
   forming a metal body on the inorganic insulating protective layer and the electrode, the metal body being in contact with the electrode through the multiple first openings of the inorganic insulating protective layer.

2. The method according to claim 1, wherein
   the electrode has a first edge and a second edge, the first edge and the second edge being disposed on a bottom of the opening of the resin body, and
   each of the multiple first openings of the inorganic insulating protective layer is defined by a first covering portion and a second covering portion, the first covering portion and the second covering portion covering the first edge and the second edge, respectively.

3. The method according to claim 2, wherein
   the inorganic insulating protective layer has a first bridge separating one of the multiple first openings from another thereof,
   the first bridge extends from one edge of a first edge of the first covering portion and a second edge of the second covering portion and returns to the one edge from which the first bridge extends, and
   the metal body is disposed over the first bridge.

4. The method according to claim 3, wherein
   the inorganic insulating protective layer has a second bridge separating one of the multiple first openings from another thereof,
   the second bridge extends from one edge of a first edge of the first covering portion and a second edge of the second covering portion and reaches to another edge thereof, and
   the metal body is disposed on the second bridge.

5. The method according to claim 2, wherein
   the inorganic insulating protective layer has a bridge separating one of the multiple first openings from another thereof,
   the bridge extends from one edge of a first edge of the first covering portion and a second edge of the second covering portion and reaches to another edge thereof, and
   the metal body is disposed on the bridge.

6. The method according to claim 1, wherein the inorganic insulating protective layer includes a silicon oxide film.

7. The method according to claim 1, wherein the resin body includes a BCB resin.

8. A Mach-Zehnder modulator comprising:
   a semiconductor mesa for an arm waveguide;
   a resin body embedding the semiconductor mesa and having an opening on a top face of the semiconductor mesa;
   an electrode disposed on the semiconductor mesa and on the resin body, the electrode being in contact with the top face of the semiconductor mesa through the opening of the resin body;
   an inorganic insulating protective layer disposed on the electrode and the resin body, the inorganic insulating protective layer having multiple openings therethrough to the electrode; and
   a metal body disposed on the inorganic insulating protective layer, the metal body being in contact with the electrode through the multiple openings of the inorganic insulating protective layer.

9. The method according to claim 8, wherein
   the electrode has a first edge and a second edge, the first edge and the second edge being disposed on a bottom of the opening of the resin body, and each of the multiple first openings of the inorganic insulating protective layer is defined by a first covering portion and a second covering portion, the first covering portion and the second covering portion covering the first edge and the second edge, respectively.

10. The Mach-Zehnder modulator according to claim 9, wherein the inorganic insulating protective layer has a bridge separating one of the multiple first openings from another thereof, the bridge extends from one edge of a first edge of the first covering portion and a second edge of the second covering portion and returns to the one edge from which the bridge extends, and the bridge has a width larger than 0.5 micrometers.

11. The Mach-Zehnder modulator according to claim 9, wherein the inorganic insulating protective layer has a bridge separating one of the multiple first openings from another thereof, the bridge extends from one edge of a first edge of the first covering portion and a second edge of the second covering portion and reaches to another edge thereof, and the bridge has a width larger than 0.5 micrometers.

* * * * *